(12) United States Patent
Liao et al.

(10) Patent No.: US 12,476,109 B2
(45) Date of Patent: Nov. 18, 2025

(54) EUV PHOTOMASK AND RELATED METHODS

(71) Applicant: Taiwan Semiconductor Manufacturing Co., Ltd., Hsinchu (TW)

(72) Inventors: Chi-Hung Liao, Taipei County (TW); Po-Ming Shih, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/366,397

(22) Filed: Aug. 7, 2023

(65) Prior Publication Data

US 2023/0386838 A1 Nov. 30, 2023

Related U.S. Application Data

(62) Division of application No. 17/111,421, filed on Dec. 3, 2020.

(Continued)

(51) Int. Cl.
*H01L 21/027* (2006.01)
*G03F 1/22* (2012.01)
(Continued)

(52) U.S. Cl.
CPC ............ *H01L 21/0274* (2013.01); *G03F 1/22* (2013.01); *G03F 1/24* (2013.01); *G03F 1/54* (2013.01);
(Continued)

(58) Field of Classification Search
CPC ............ H01L 21/0274; H01L 21/0332; H01L 21/0337; G03F 1/22; G03F 1/24;
(Continued)

(56) References Cited

U.S. PATENT DOCUMENTS 6,004,699 A * 12/1999 Yasuzato ................... G03F 1/30
430/5
8,796,666 B1 8/2014 Huang et al.
(Continued)

FOREIGN PATENT DOCUMENTS

CN 107452602 A 12/2017
DE 102007006144 A1 8/2007
(Continued)

OTHER PUBLICATIONS

Yasin Ekinci, Michaela Vockenhuber, Nassir Mojarad, Daniel Fan, "EUV resists towards 11nm half-pitch," Proc. SPIE 9048, Extreme Ultraviolet (EUV) Lithography V, 9049804 (Apr. 17, 2014) (Year: 2014).*

(Continued)

*Primary Examiner* — Jonathan Johnson
*Assistant Examiner* — Alexander N. Lee
(74) *Attorney, Agent, or Firm* — Haynes and Boone, LLP

(57) ABSTRACT

A method of fabricating a semiconductor device includes providing a first substrate and forming a resist layer over the first substrate. In some embodiments, the method further includes performing an exposure process to the resist layer. The exposure process includes exposing the resist layer to a radiation source through an intervening mask. In some examples, the intervening mask includes a second substrate, a multi-layer structure formed over the second substrate, a capping layer formed over the multi-layer structure, and an absorber layer disposed over the capping layer. In some embodiments, the absorber layer includes a first main pattern area and an opening area spaced a distance from the first main pattern area. In various examples, the method further includes, after performing the exposure process, developing the exposed resist layer to form a patterned resist layer.

20 Claims, 10 Drawing Sheets

Related U.S. Application Data

(60) Provisional application No. 63/016,653, filed on Apr. 28, 2020.

(51) Int. Cl.
 G03F 1/24 (2012.01)
 G03F 1/54 (2012.01)
 G03F 7/20 (2006.01)
 H01L 21/033 (2006.01)

(52) U.S. Cl.
 CPC .......... G03F 7/2002 (2013.01); G03F 7/2004 (2013.01); H01L 21/0332 (2013.01)

(58) Field of Classification Search
 CPC ........ G03F 1/54; G03F 7/2002; G03F 7/2004; G03F 1/38
 See application file for complete search history.

(56) References Cited

U.S. PATENT DOCUMENTS

| | | |
|---|---|---|
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 9,869,934 B2 | 1/2018 | Huang et al. |
| 9,869,939 B2 | 1/2018 | Yu et al. |
| 2003/0148635 A1* | 8/2003 | Hasegawa ........... G03F 7/70433 430/311 |
| 2008/0138997 A1* | 6/2008 | Huang ............ H01L 21/31138 257/E21.252 |
| 2009/0246706 A1* | 10/2009 | Hendel ............... H01L 21/3088 430/323 |
| 2013/0029253 A1 | 1/2013 | Mangat et al. |
| 2014/0030894 A1* | 1/2014 | Shin ...................... H01L 21/308 430/5 |
| 2014/0363633 A1* | 12/2014 | Kim ......................... G03F 1/38 430/5 |
| 2016/0349412 A1 | 12/2016 | Bowering |
| 2017/0176850 A1 | 6/2017 | Chen et al. |
| 2017/0200523 A1 | 7/2017 | Umstadter |
| 2018/0067390 A1* | 3/2018 | Kwon ....................... G03F 1/38 |
| 2019/0172717 A1 | 6/2019 | Ko et al. |
| 2020/0050098 A1 | 2/2020 | Lin et al. |

FOREIGN PATENT DOCUMENTS

| | | |
|---|---|---|
| DE | 102017122398 A1 | 3/2019 |
| DE | 102018124819 A1 | 5/2019 |
| DE | 102019121624 A1 | 2/2020 |
| KR | 20170072768 A | 6/2017 |
| KR | 20190066389 A | 6/2019 |
| TW | 201905965 A | 2/2019 |
| TW | 202006474 A | 2/2020 |
| WO | 2013027412 A1 | 2/2013 |

OTHER PUBLICATIONS

Bing Lu, James R. Wasson, Sang-In Han, Pawitter Mangat, Victoria Golovkina, Franco Cerrina, "EUV radiation damage test on EUVL mask absorber materials," Proc. SPIE 5256, 23rd Annual BACUS Symposium on Photomask Technology, (Dec. 17, 2003) (Year: 2003).

* cited by examiner

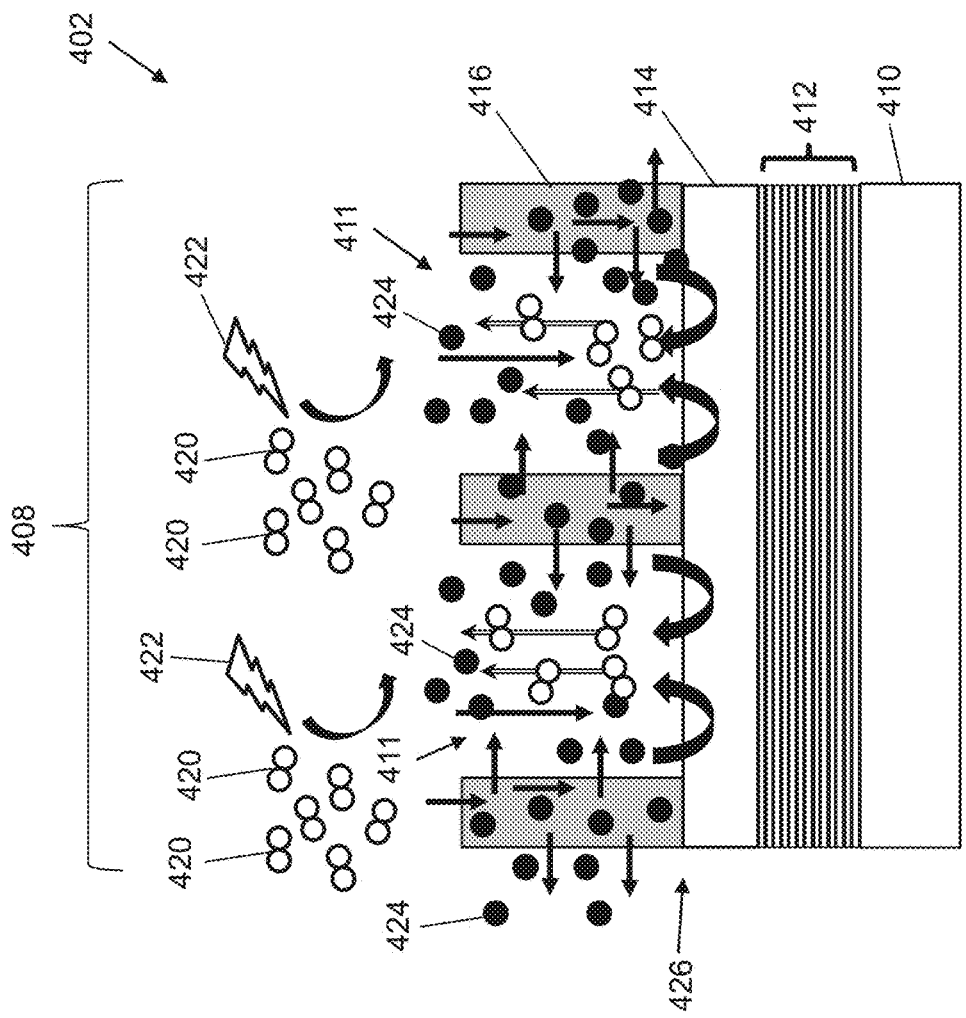
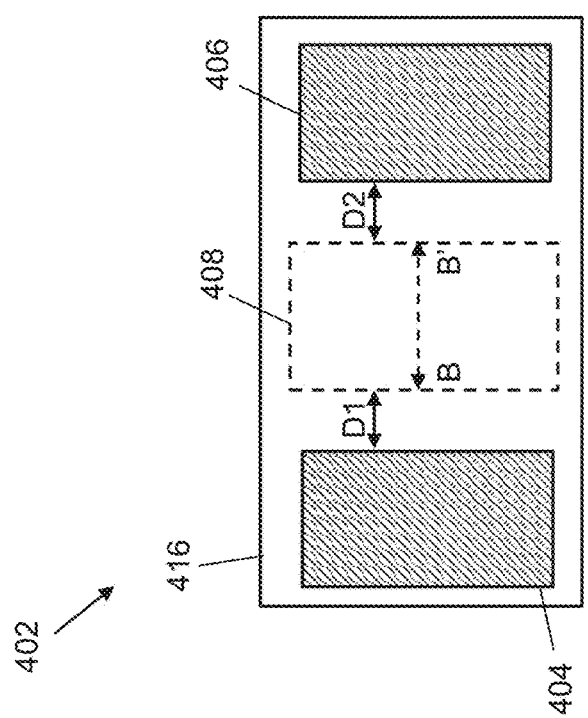
FIG. 4B
FIG. 4A

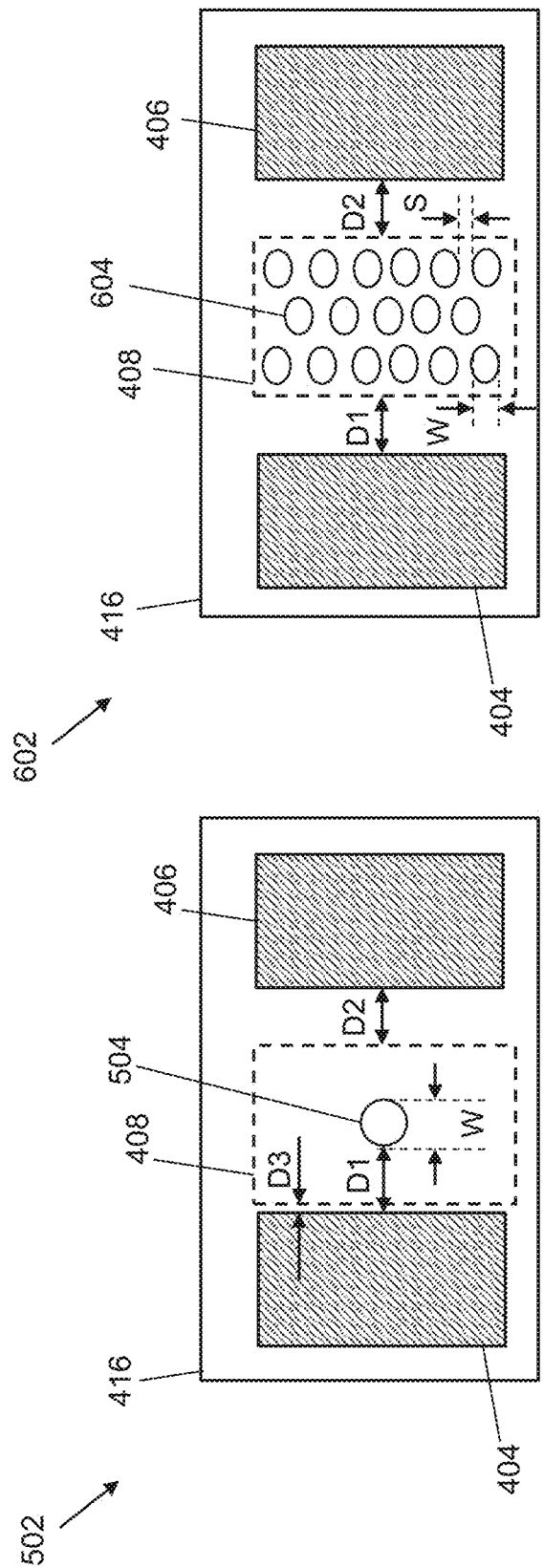

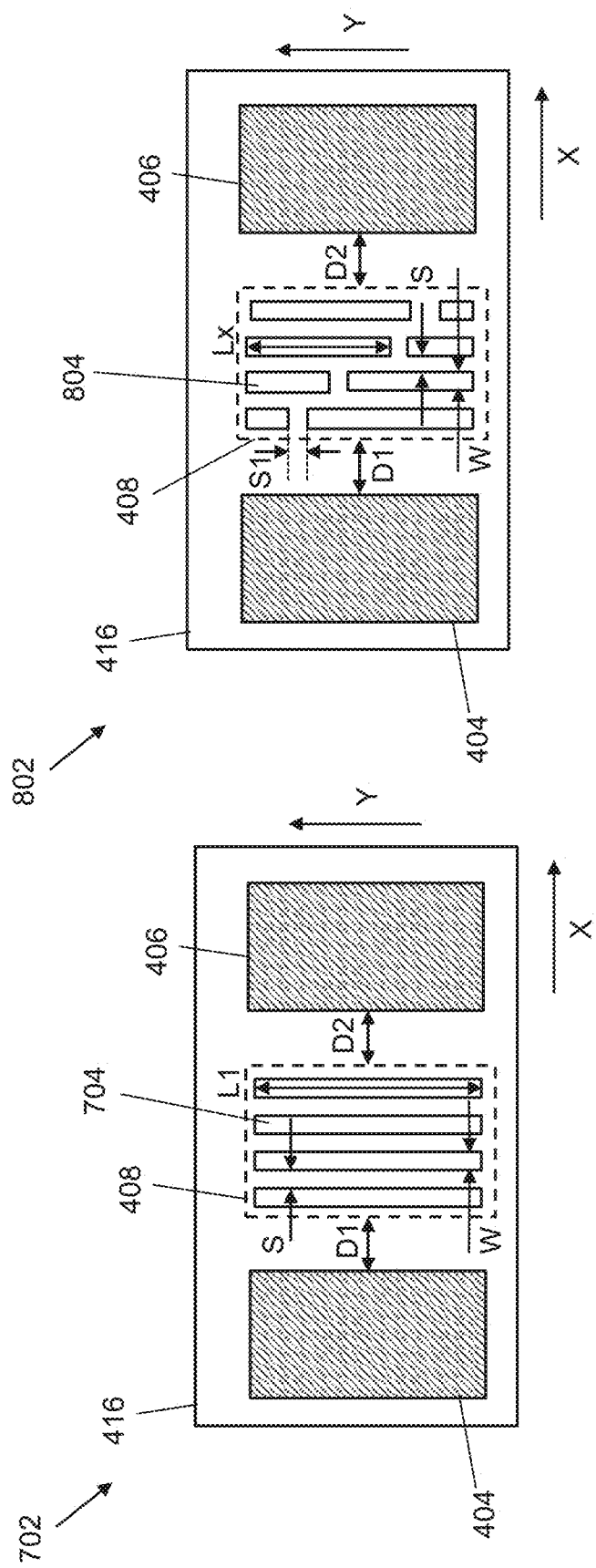

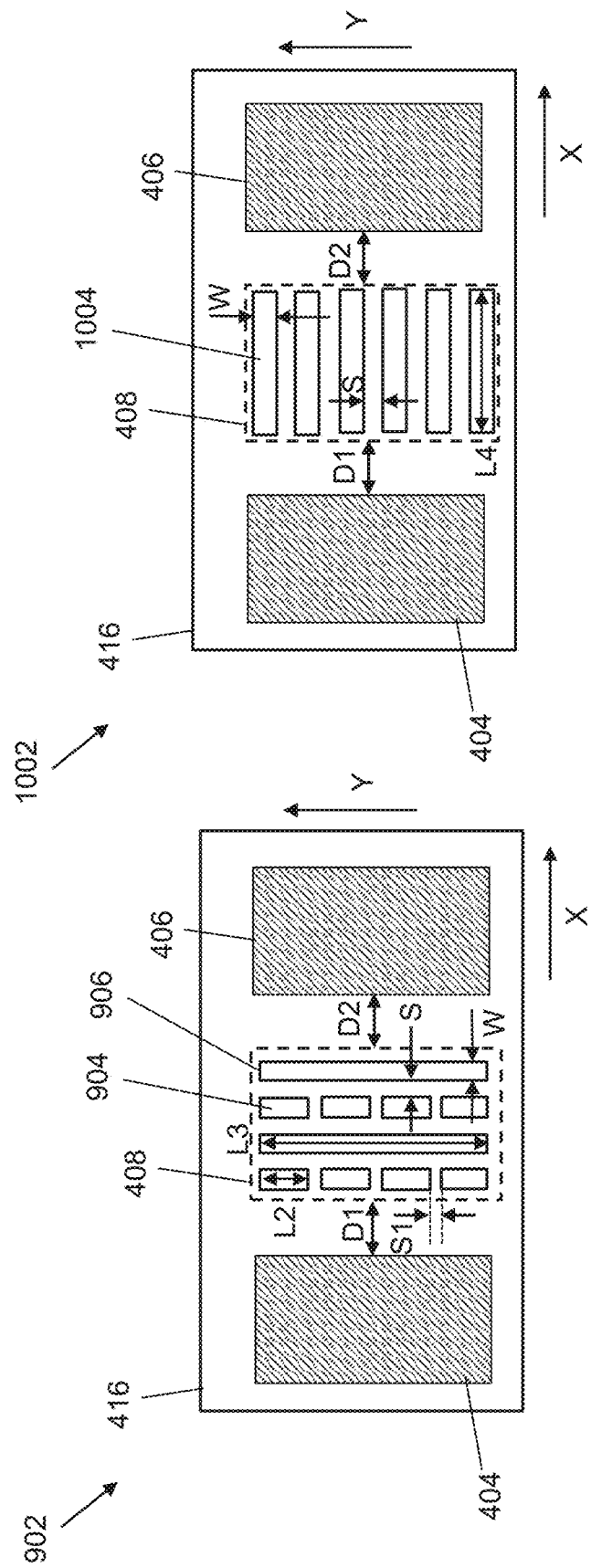

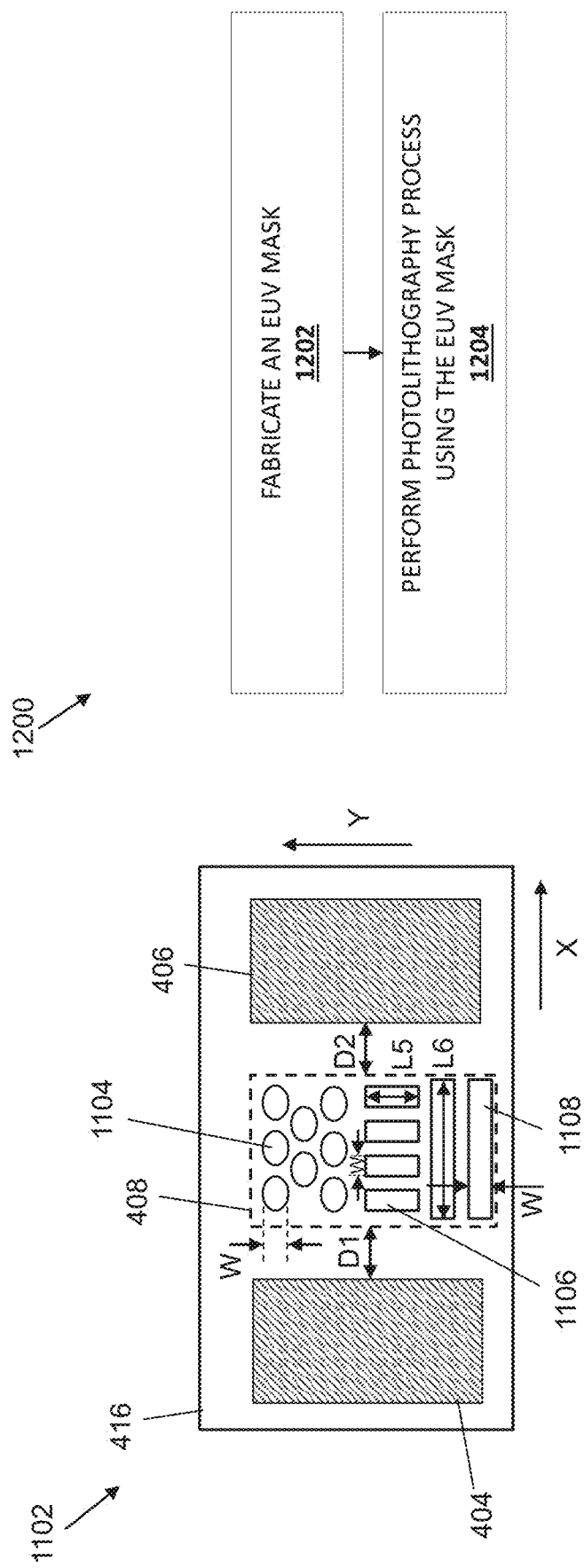

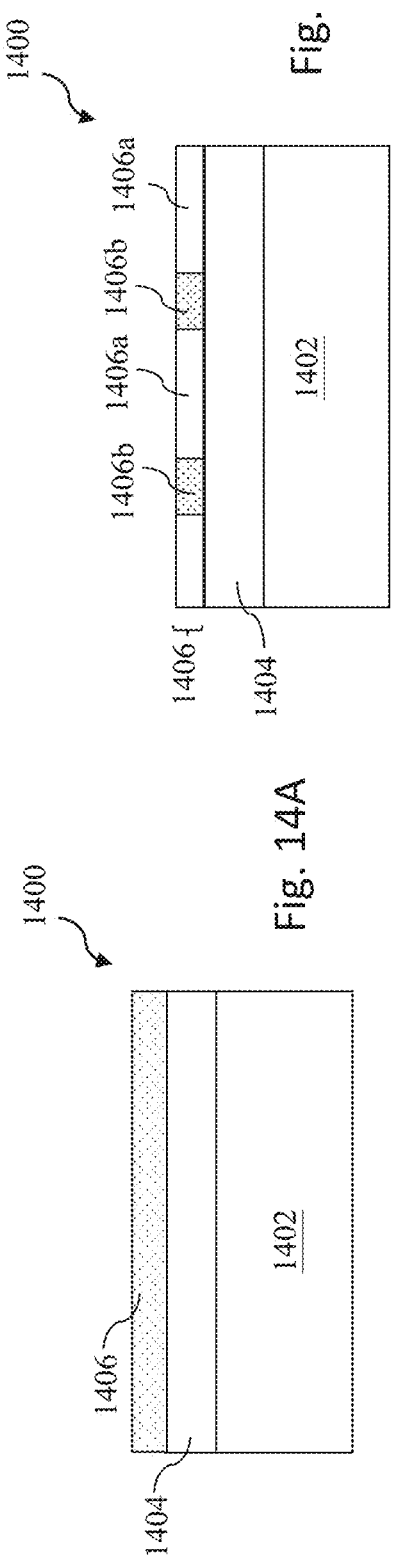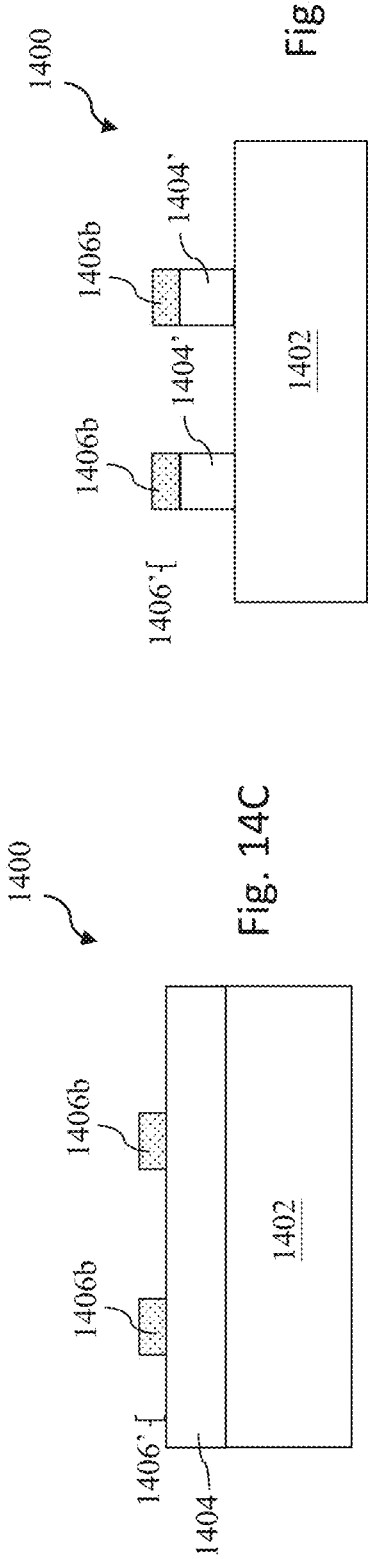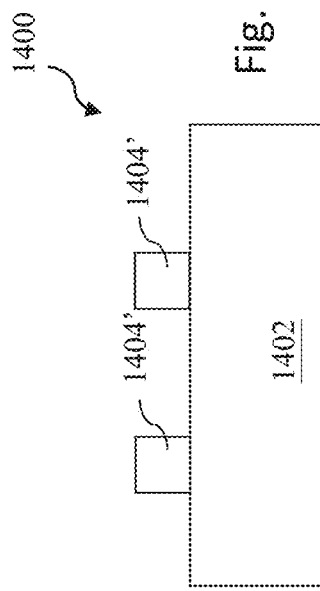

continued …

EUV PHOTOMASK AND RELATED METHODS

CROSS-REFERENCE TO RELATED APPLICATION

This application is a divisional of U.S. patent application Ser. No. 17/111,421, filed Dec. 3, 2020, which claims the benefit of U.S. Provisional Application No. 63/016,653, filed Apr. 28, 2020, the entireties of which are incorporated by reference herein.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As merely one example, semiconductor lithography processes may use lithographic templates (e.g., photomasks or reticles) to optically transfer patterns onto a substrate. Such a process may be accomplished, for example, by projection of a radiation source, through an intervening photomask or reticle, onto the substrate having a photosensitive material (e.g., photoresist) coating. The minimum feature size that may be patterned by way of such a lithography process is limited by the wavelength of the projected radiation source. In view of this, extreme ultraviolet (EUV) radiation sources and lithographic processes, including EUV photomasks ("masks"), have been introduced. However, EUV masks may degrade with usage, resulting in poor pattern transfer that can result in device and/or circuit degradation or failure.

As such, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a top-view and FIG. 4B is a cross-sectional view of a mask including an opening area between main pattern areas, according to some embodiments;

FIGS. 5, 6, 7, 8, 9, 10, and 11 provide top-views of masks having a variety of different openings formed within an opening area, according to some embodiments;

FIG. 12 is a flow chart of a simplified method for fabricating and using an EUV mask, according to one or more aspects of the present disclosure;

FIGS. 14A, 14B, 14C, 14D, and 14E provide cross-sectional views of a semiconductor device at various fabrication stages, constructed in accordance with some embodiments of the method of FIG. 13.

DETAILED DESCRIPTION

Figure 1:
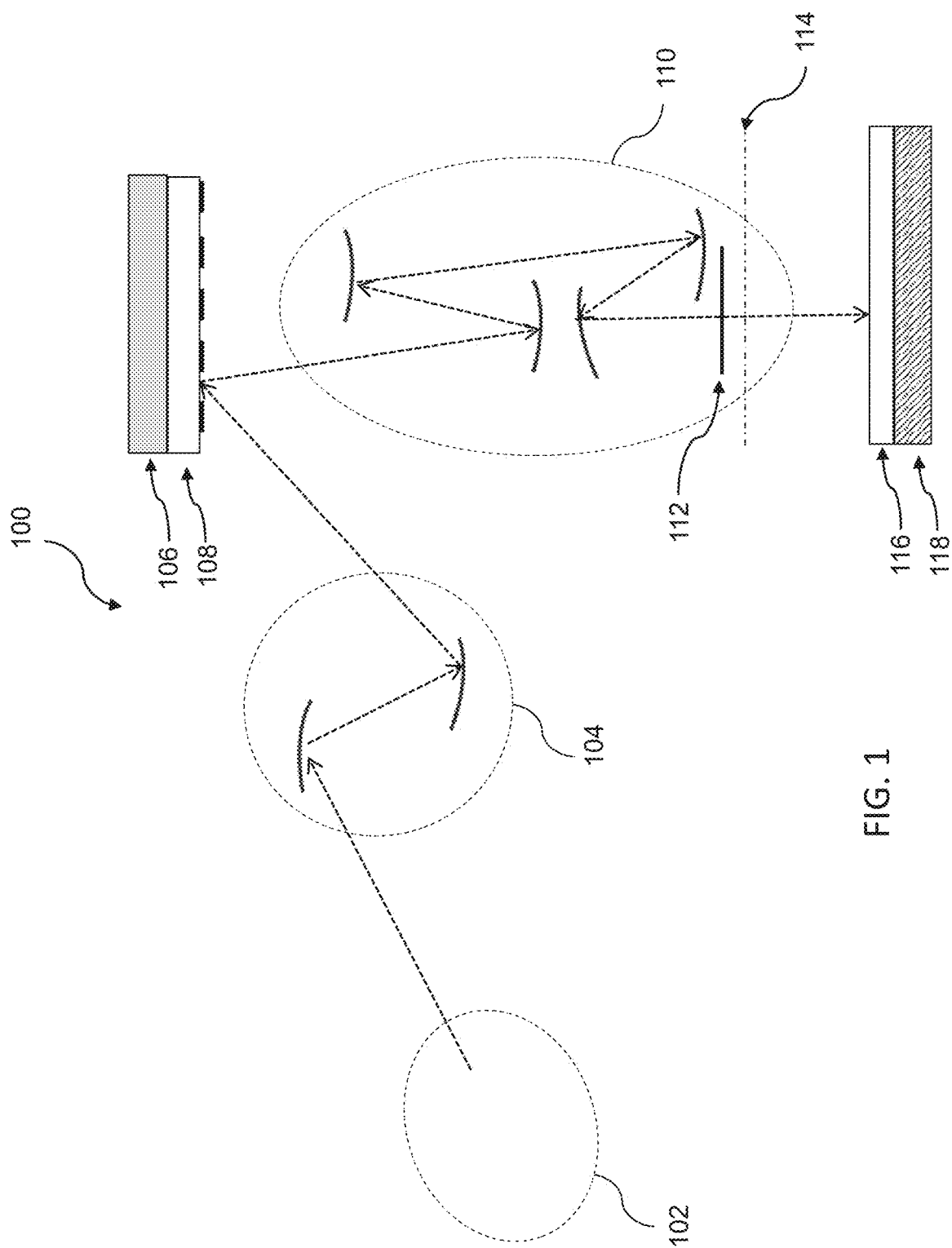
FIG. 1 is a schematic view of a lithography system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Additionally, throughout the present disclosure, the terms "mask", "photomask", and "reticle" may be used interchangeably to refer to a lithographic template, such as an EUV mask.

Illustrated in FIG. 1 is a schematic view of a lithography system 100, in accordance with some embodiments. The lithography system 100 may also be generically referred to as a scanner that is operable to perform lithographic processes including exposure with a respective radiation source and in a particular exposure mode. In at least some of the present embodiments, the lithography system 100 includes an extreme ultraviolet (EUV) lithography system designed to expose a resist layer by EUV light. Inasmuch, in various embodiments, the resist layer includes a material sensitive to the EUV light (e.g., an EUV resist). The lithography system 100 of FIG. 1 includes a plurality of subsystems such as a radiation source 102, an illuminator 104, a mask stage 106 configured to receive a mask 108, projection optics 110, and a substrate stage 118 configured to receive a semiconductor substrate 116. A general description of the operation of the lithography system 100 may be given as follows: EUV light from the radiation source 102 is directed toward the illuminator 104 (which includes a set of reflective mirrors) and projected onto the reflective mask 108. A reflected mask image is directed toward the projection optics 110, which focuses the EUV light and projects the EUV light onto the semiconductor substrate 116 to expose an EUV resist layer deposited thereupon. Additionally, in various examples, each subsystem of the lithography system 100 may be housed in, and thus operate within, a high-vacuum environment, for example, to reduce atmospheric absorption of EUV light.

In the embodiments described herein, the radiation source 102 may be used to generate the EUV light. In some embodiments, the radiation source 102 includes a plasma source, such as for example, a discharge produced plasma (DPP) or a laser produced plasma (LPP). In some examples, the EUV light may include light having a wavelength ranging from about 1 nm to about 100 nm. In one particular example, the radiation source 102 generates EUV light with a wavelength centered at about 13.5 nm. Accordingly, the radiation source 102 may also be referred to as an EUV radiation source 102. In some embodiments, the radiation source 102 also includes a collector, which may be used to collect EUV light generated from the plasma source and to direct the EUV light toward imaging optics such as the illuminator 104.

As described above, light from the radiation source 102 is directed toward the illuminator 104. In some embodiments, the illuminator 104 may include reflective optics (e.g., for the EUV lithography system 100), such as a single mirror or a mirror system having multiple mirrors in order to direct light from the radiation source 102 onto the mask stage 106, and particularly to the mask 108 secured on the mask stage 106. In some examples, the illuminator 104 may include a zone plate, for example, to improve focus of the EUV light. In some embodiments, the illuminator 104 may be configured to shape the EUV light passing therethrough in accordance with a particular pupil shape, and including for example, a dipole shape, a quadrapole shape, an annular shape, a single beam shape, a multiple beam shape, and/or a combination thereof. In some embodiments, the illuminator 104 is operable to configure the mirrors (i.e., of the illuminator 104) to provide a desired illumination to the mask 108. In one example, the mirrors of the illuminator 104 are configurable to reflect EUV light to different illumination positions. In some embodiments, a stage prior to the illuminator 104 may additionally include other configurable mirrors that may be used to direct the EUV light to different illumination positions within the mirrors of the illuminator 104. In some embodiments, the illuminator 104 is configured to provide an on-axis illumination (ONI) to the mask 108. In some embodiments, the illuminator 104 is configured to provide an off-axis illumination (OAI) to the mask 108. It should be noted that the optics employed in the EUV lithography system 100, and in particular optics used for the illuminator 104 and the projection optics 110, may include mirrors having multilayer thin-film coatings known as Bragg reflectors. By way of example, such a multilayer thin-film coating may include alternating layers of Mo and Si, which provides for high reflectivity at EUV wavelengths (e.g., about 13 nm).

As discussed above, the lithography system 100 also includes the mask stage 106 configured to secure the mask 108. Since the lithography system 100 may be housed in, and thus operate within, a high-vacuum environment, the mask stage 106 may include an electrostatic chuck (e-chuck) to secure the mask 108. As with the optics of the EUV lithography system 100, the mask 108 is also reflective. Details of the mask 108 are discussed in more detail below with reference to the example of FIG. 2. As illustrated in the example of FIG. 1, light is reflected from the mask 108 and directed towards the projection optics 110, which collects the EUV light reflected from the mask 108. By way of example, the EUV light collected by the projection optics 110 (reflected from the mask 108) carries an image of the pattern defined by the mask 108. In various embodiments, the projection optics 110 provides for imaging the pattern of the mask 108 onto the semiconductor substrate 116 secured on the substrate stage 118 of the lithography system 100. In particular, in various embodiments, the projection optics 110 focuses the collected EUV light and projects the EUV light onto the semiconductor substrate 116 to expose an EUV resist layer deposited on the semiconductor substrate 116. As described above, the projection optics 110 may include reflective optics, as used in EUV lithography systems such as the lithography system 100. In some embodiments, the illuminator 104 and the projection optics 110 are collectively referred to as an optical module of the lithography system 100.

In some embodiments, the lithography system 100 also includes a pupil phase modulator 112 to modulate an optical phase of the EUV light directed from the mask 108, such that the light has a phase distribution along a projection pupil plane 114. In some embodiments, the pupil phase modulator 112 includes a mechanism to tune the reflective mirrors of the projection optics 110 for phase modulation. For example, in some embodiments, the mirrors of the projection optics 110 are configurable to reflect the EUV light through the pupil phase modulator 112, thereby modulating the phase of the light through the projection optics 110. In some embodiments, the pupil phase modulator 112 utilizes a pupil filter placed on the projection pupil plane 114. By way of example, the pupil filter may be employed to filter out specific spatial frequency components of the EUV light reflected from the mask 108. In some embodiments, the pupil filter may serve as a phase pupil filter that modulates the phase distribution of the light directed through the projection optics 110.

As discussed above, the lithography system 100 also includes the substrate stage 118 to secure the semiconductor substrate 116 to be patterned. In various embodiments, the semiconductor substrate 116 includes a semiconductor wafer, such as a silicon wafer, germanium wafer, silicon-germanium wafer, III-V wafer, or other type of wafer as known in the art. The semiconductor substrate 116 may be coated with a resist layer (e.g., an EUV resist layer) sensitive to EUV light. EUV resists may have stringent performance standards. For purposes of illustration, an EUV resist may be designed to provide at least around 22 nm resolution, at least around 2 nm line-width roughness (LWR), and with a sensitivity of at least around 15 mJ/cm$^2$. In the embodiments described herein, the various subsystems of the lithography system 100, including those described above, are integrated and are operable to perform lithography exposing processes including EUV lithography processes. To be sure, the lithography system 100 may further include other modules or subsystems which may be integrated with (or be coupled to) one or more of the subsystems or components described herein.

Figure 2:
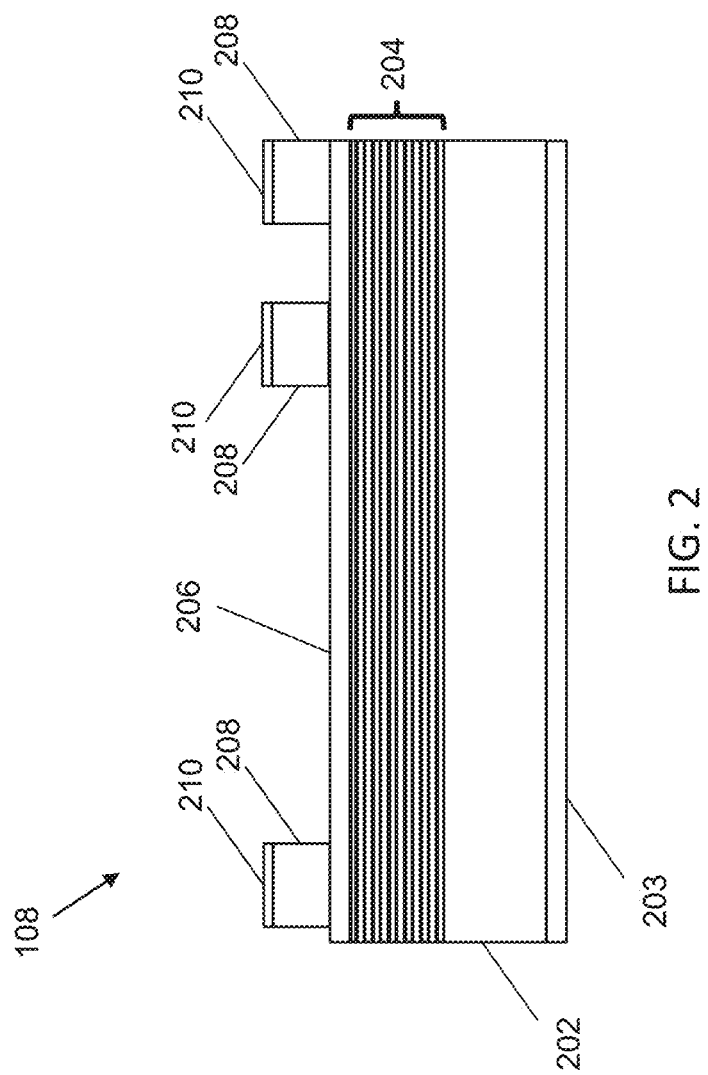
FIG. 2 is a cross-section of an EUV mask, in accordance with some embodiments.

Returning to the mask 108, and with reference to the example of FIG. 2, illustrated therein is an example cross-section of the EUV mask 108 of FIG. 1. As shown in FIG. 2, the EUV mask 108 may include a substrate 202 having a backside coating layer 203, a multi-layer structure 204, a capping layer 206, and one or more absorbers 208 having an anti-reflective coating (ARC) layer 210. In some embodiments, the substrate 202 includes a low thermal expansion material (LTEM) substrate (e.g., such as $TiO_2$ doped $SiO_2$), and the backside coating layer 203 includes a chromium nitride ($Cr_xN_y$) layer. In some examples, the substrate 202 has a thickness of about 6.3 to 6.5 mm. In some examples, the backside coating 203 has a thickness of about 70-100 nm. By way of example, the multi-layer structure 204 may include molybdenum-silicon (Mo—Si) multi-layers deposited on top of the substrate 202 for example, using an ion deposition technique. In some embodiments, the multi-layer structure 204 has a thickness of about 250-350 nm, and in some examples each Mo—Si layer pair has a thickness of about 3 nm (for the Mo layer) and about 4 nm (for the Si layer). In various embodiments, the capping layer 206 includes a ruthenium (Ru) capping layer, which in some examples may have a thickness of about 2.5 nm. In some embodiments, the capping layer 206 may include a Si capping layer having a thickness of about 4 nm. The capping layer 206 may help to protect the multi-layer structure 204 (e.g., during fabrication of the mask 108) and may also serve as an etch-stop layer for a subsequent absorber layer etch process. In some embodiments, the absorbers 208 may include for example, a TaBO layer, a TaBN layer, a TaBO/TaBN layer, a $Ta_xN_y$ layer, a $Ta_xB_yO_zN_u$ layer, or a combination thereof, which may have a thickness of about 50-75 nm and are configured to absorb EUV light (e.g., with a wavelength of about 13.5 nm). In some examples, other materials may be used for the absorbers 208, such as Al, Cr, Ta, and W, among others. In some examples, the ARC layer 210 includes at least one of a $Ta_xB_yO_zN_u$ layer, a $Hf_xO_y$ layer, or a $Si_xO_yN_z$ layer. While some examples of materials that may be used for each of the substrate 202, the backside coating layer 203, the multi-layer structure 204, the capping layer 206, the absorbers 208, and the ARC layer 210 have been given, it will be understood that other suitable materials as known in the art may be equally used without departing from the scope of the present disclosure.

For purposes of illustration, an exemplary fabrication method for the mask 108 is herein described. In some embodiments, the fabrication process includes two process stages: (1) a mask blank fabrication process, and (2) a mask patterning process. During the mask blank fabrication process, the mask blank is formed by depositing suitable layers (e.g., reflective multiple layers such as Mo—Si multi-layers) on a suitable substrate (e.g., an LTEM substrate having a flat, defect-free surface). In various embodiments, the surface roughness of the mask blank is less than about 50 nm. By way of example, a capping layer (e.g., ruthenium) is formed over the multilayer coated substrate followed by deposition of an absorber layer. The mask blank may then be patterned (e.g., the absorber layer is patterned) to form a desired pattern on the mask 108. In some embodiments, an ARC layer may be deposited over the absorber layer prior to patterning the mask blank. The patterned mask 108 may then be used to transfer circuit and/or device patterns onto a semiconductor wafer. In various embodiments, the patterns defined by the mask 108 can be transferred over and over onto multiple wafers through various lithography processes. In addition, a set of masks (such as the mask 108) may be used to construct a complete integrated circuit (IC) device and/or circuit.

In various embodiments, the mask 108 (described above) may be fabricated to include different structure types such as, for example, a binary intensity mask (BIM) or a phase-shifting mask (PSM). An illustrative BIM includes opaque absorbing regions and reflective regions, where the BIM includes a pattern (e.g., and IC pattern) to be transferred to the semiconductor substrate 116. The opaque absorbing regions include an absorber, as described above, that is configured to absorb incident light (e.g., incident EUV light). In the reflective regions, the absorber has been removed (e.g., during the mask patterning process described above) and the incident light is reflected by the multi-layer. Additionally, in some embodiments, the mask 108 may include a PSM which utilizes interference produced by phase differences of light passing therethrough. Examples of PSMs include an alternating PSM (AltPSM), an attenuated PSM (AttPSM), and a chromeless PSM (cPSM). By way of example, an AltPSM may include phase shifters (of opposing phases) disposed on either side of each patterned mask feature. In some examples, an AttPSM may include an absorber layer having a transmittance greater than zero (e.g., Mo—Si having about a 6% intensity transmittance). In some cases, a cPSM may be described as a 100% transmission AltPSM, for example, because the cPSM does not include phase shifter material or chrome on the mask.

As described above, the mask 108 includes a patterned image that may be used to transfer circuit and/or device patterns onto a semiconductor wafer (e.g., the semiconductor substrate 116) by the lithography system 100. To achieve a high fidelity pattern transfer from the patterned mask 108 to the semiconductor substrate 116, the lithography process should be defect-free. In some cases, mask defects may present themselves as particles that may be unintentionally deposited on the surface of the capping layer and can result in degradation of lithographically transferred patterns if not removed. Particles may be introduced by any of a variety of methods such as during a chemical mechanical polishing (CMP) process, a cleaning process, and/or during handling of the EUV mask 108. At least some existing methods for avoiding and/or removing particle contamination from a reflective EUV mask (e.g., the mask 108) include wet chemical processes to clean the mask. Alternatively, or in addition to, mask cleaning techniques, a pellicle membrane may be used over an EUV mask to serve as a protective cover which protects the mask from damage and/or contaminant particles. By way of example, a pellicle membrane is suspended (e.g., by a frame attached to the EUV mask) a distance (e.g., several millimeters) away from the patterned surface of the mask, while remaining within an optical path between the patterned surface and a wafer to be patterned, such that any particles which land on the pellicle membrane (e.g., rather than on the patterned surface of the mask) are held away from a focal plane of the projection optics 110 and will thus not be imaged onto a target semiconductor wafer.

In other cases, mask defects may present themselves during a lithography process. For example, in at least some EUV lithography processes, hydrogen ion and/or helium implantation-induced surface blistering and layer splitting of the EUV mask may occur during an EUV exposure process. In various examples, surface blistering causes film swelling of an EUV mask absorber layer and peeling away of the absorber layer from an underlying capping layer, resulting in a defective EUV mask. Patterns transferred onto a substrate using the defective EUV mask may have a low fidelity as compared to a target pattern, leading to device and/or circuit degradation or failure. Thus, such defective EUV masks may instead be scrapped. As such, existing techniques have not proved entirely satisfactory in all respects.

Figures 3A, 3B:
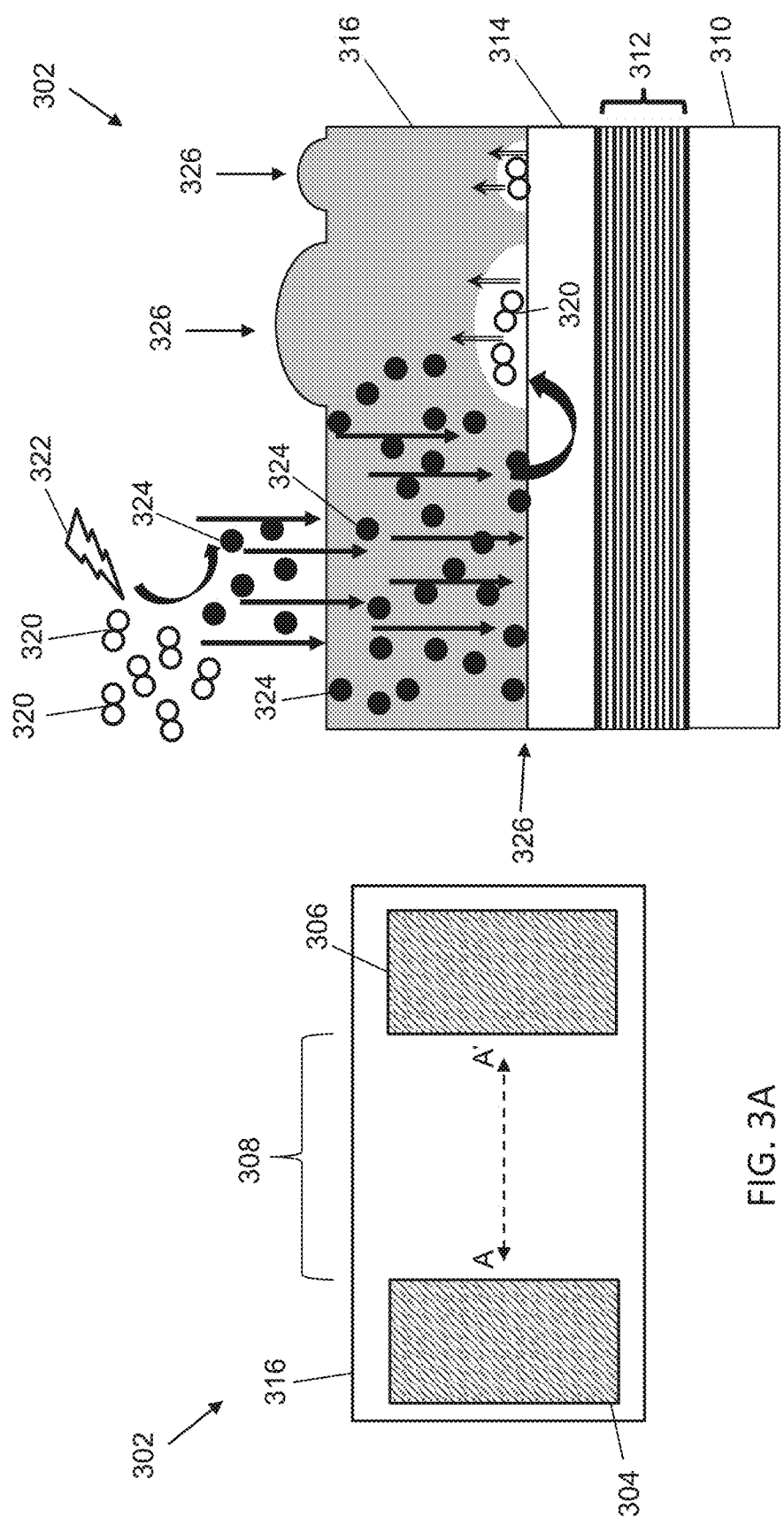
FIG. 3A is a top-view and FIG. 3B is a cross-sectional view of a mask including an un-patterned region between main pattern areas.

To further illustrate the process by which mask defects may be formed during an EUV lithography process, reference is made to FIGS. 3A/3B, which illustrate an exemplary mask 302. In particular, FIG. 3A provides a top view of the mask 302, and FIG. 3B provides a cross-section view of the mask 302 along a plane substantially parallel to the section AA' of FIG. 3A. In some respects, the mask 302 may be similar to the mask 108, described above with reference to FIG. 2. For example, the mask 302 may include a substrate 310, a multi-layer structure 312, a capping layer 314, and an absorber layer 316, which may be substantially the same as the substrate 202, the multi-layer structure 204, the capping layer 206, and the absorber layer 208, respectively, as described above. In some examples, the mask 302 includes a first main pattern area 304 and a second main pattern area 306. By way of example, the main patterns areas 304, 306 include regions where the absorber layer 316 has been patterned, for example, to define various features (e.g., as part of a semiconductor device and/or circuit) for transfer to a semiconductor wafer as part of a photolithography process using the mask 302.

As shown, the mask 302 also includes a region 308 between the main pattern areas 304, 306 where the absorber layer 316 has not been patterned. In at least some techniques, it is within such un-patterned regions 308 of the mask 302 that surface blistering and layer splitting of the mask may occur. For example, and with reference to FIG. 3B, an EUV lithography exposure may be performed in a vacuum environment including ambient hydrogen ($H_2$) 320. In some cases, EUV light 322 from the exposure process may interact with the hydrogen 320 to produce hydrogen ions 324 (e.g., $H^-$ or $H^+$). The generated hydrogen ions 324 may then penetrate into, and diffuse through, the absorber layer 316. When the diffusing hydrogen ions 324 reach an interface 326 between the absorber layer 316 and the capping layer 314, the hydrogen ions 324 may react with a metal layer within the capping layer 314 (e.g., such as Ru) to form hydrogen ($H_2$) 320. As a result, the hydrogen 320 formed at the interface 326 may accumulate between the capping layer 314 and the absorber layer 316 and cause a surface of the absorber layer 316 to protrude and form blisters 326. The blisters 326, in turn, may cause the capping layer 314 and the absorber layer 316 to peel off from each other. Thus, the mask 302 may be scrapped.

While the above example has been described with reference to hydrogen ($H_2$) interacting with the EUV light 322, such surface blistering and layer splitting may also occur due to helium ion implantation. For instance, in some cases, helium ions introduced during a helium ion beam lithography process may similarly penetrate into the absorber layer 316 and accumulate at the interface 326, forming blisters 326. In addition, while the example of FIGS. 3A/3B is shown and described as having surface blisters form within the un-patterned region 308 between the main pattern areas 304, 306, it will be understood that such an example is not meant to be limiting, and that surface blistering may also occur in other un-patterned regions on other sides of the main pattern areas 304, 306.

Embodiments of the present disclosure offer advantages over the existing art, though it is understood that other embodiments may offer different advantages, not all advantages are necessarily discussed herein, and no particular advantage is required for all embodiments. For example, embodiments of the present disclosure provide an EUV mask and related methods designed to address shortcomings of at least some existing techniques, as described above. For example, in various embodiments, an EUV mask includes one or more openings within the absorber layer, where the one or more openings are spaced away from a main pattern area. By way of example, the openings may expose the underlying capping layer, and the openings may be disposed a sufficient distance away from the main pattern area so that the main pattern area will not be affected by the one or more openings. As noted above, a main patterns area may include regions where the absorber layer has been patterned to define various features (e.g., as part of a device and/or circuit) for transfer to a semiconductor wafer as part of a photolithography process. Thus, in some embodiments, the one or more openings disclosed herein may be disposed a sufficient distance away from the main pattern area so that the features defined by the main pattern area can be transferred to the semiconductor wafer (e.g., by an EUV lithography process) with high-fidelity with substantially no impact from the one or more openings.

In various embodiments, the addition of the one or more openings in the absorber layer, and away from the main pattern area, provides for reduced thermal film expansion (e.g., which causes the surface blistering and layer splitting). Thus, the mask structure disclosed herein provides for reduction and/or elimination of the blistering and peeling issue faced in at least some processes. In some examples, an EUV mask includes a main pattern area and an opening area, where the opening area includes the one or more openings. In various embodiments, the opening area includes at least one opening, and each opening within the opening area penetrates the EUV mask absorber layer and exposes an underlying capping layer, where the capping layer may include Ru. In some embodiments, thermal expansion of the EUV mask may be further reduced by increasing the size and number of the openings within the opening area. By way of example, the openings within the opening area provide for the release of hydrogen gas to the atmosphere, without accumulation of hydrogen between the absorber layer and the capping layer. Additionally, and in some embodiments, the one or more openings in the opening area and features formed in the main pattern area may be formed simultaneously. Those skilled in the art will recognize other benefits and advantages of the methods and structures as described herein, and the embodiments described are not meant to be limiting beyond what is specifically recited in the claims that follow.

With reference now to FIGS. 4A/4B, illustrated therein is an exemplary mask 402 including one or more openings formed within an opening area, in accordance with various embodiments. In particular, FIG. 4A provides a top view of the mask 402, and FIG. 4B provides a cross-section view of the mask 402 along a plane substantially parallel to the section BB' of FIG. 4A. In some respects, the mask 402 may be similar to the mask 108, described above with reference to FIG. 2, and the mask 402 may be used in a lithography system such as the lithography system 100, discussed above with reference to FIG. 1. In some examples, the mask 402 may include a substrate 410, a multi-layer structure 412, a capping layer 414, and an absorber layer 416, which may be substantially the same as the substrate 202, the multi-layer structure 204, the capping layer 206, and the absorber layer 208, respectively, as described above. In some embodiments, the mask 402 may also include a backside coating layer (e.g., such as the backside coating layer 203) and an ARC layer (e.g., such as the ARC layer 210). In some examples, the mask 402 includes a first main pattern area 404 and a second main pattern area 406, which may be similar to the main pattern areas 304, 306, discussed above. Thus, the main patterns areas 404, 406 may include regions where the absorber layer 416 has been patterned, for example, to define various features (e.g., as part of a device and/or circuit) for transfer to a semiconductor wafer as part of a photolithography process using the mask 402.

In contrast to at least some masks which include an un-patterned region between main pattern areas (e.g., such as the un-patterned region 308), and in some embodiments, the mask 402 includes an opening area 408 between the main pattern areas 404, 406 and away from the main pattern areas 404, 406. In contrast to the main pattern areas 404, 406, and in some embodiments, the opening area 408 may not necessarily define features which form part of a semiconductor device and/or circuit. It will be understood that an opening area need not necessarily be disposed between two main pattern areas. For instance, in some cases, an opening area may have a main pattern area disposed on one side of the opening area but not on the other side of the opening area. Further, in some examples, a plurality of opening areas (each having at least one opening) may be disposed within different portions of the mask, as long as each opening area is spaced a sufficient distance away from an adjacent main pattern area, as described further herein. The opening area 408, as well as any other opening areas on the mask 402, includes at least one opening within the absorber layer 416 of the mask 402 that exposes the underlying capping layer 416. As shown, and in some examples, the opening area 408 is spaced a distance 'D1' from the main pattern area 404 and a distance 'D2' from the main pattern area 406. In some embodiments, the distance 'D1' is the same as the distance 'D2'. However, in some cases, the distance 'D1' may be different than the distance 'D2'. In some examples, each of the distances 'D1' and 'D2' may be less than or equal to about 5 microns. By providing the distances 'D1' and 'D2' between the opening area 408 and respective main pattern areas 404, 406, the main pattern areas 404, 406 will not be affected by openings formed within the opening area 408. Stated another way, the distances 'D1' and 'D2' between the opening area 408 and respective main pattern areas 404, 406 ensure that the features defined by the main pattern areas 404, 406 can be transferred to a semiconductor wafer (e.g., by an EUV lithography process) using the mask 402 with high-fidelity and with substantially no impact from openings formed within the opening area 408.

In accordance with various embodiments, the openings formed within the opening area 408 provide for the release of hydrogen gas to the atmosphere, without accumulation of hydrogen between the absorber layer and the capping layer. Thus, the openings formed provide for reduced thermal film expansion, as well as reduction and/or elimination of surface blistering and layer splitting. For purposes of illustration, reference is made to FIG. 4B, which shows an EUV lithography exposure process using the mask 402 that includes the opening area 408 and having openings 411. It is noted that the number of openings 411, as well as the shape and size of the openings 411, is merely exemplary, and openings formed within the opening area 408 may include any number of a plurality of openings having a variety of shapes and sizes, as discussed in more detail below. In some embodiments, the EUV exposure process is performed in a vacuum environment including ambient hydrogen ($H_2$) 420. In some cases, EUV light 422 from the exposure process may interact with the hydrogen 420 to produce hydrogen ions 424 (e.g., $H^-$ or $H^+$). At least some of the generated hydrogen ions 424 may penetrate into, and diffuse through, portions of the patterned absorber layer 416 within the opening area 408 to reach an interface 426 between the absorber layer 416 and the capping layer 414. Alternatively, some of the generated hydrogen ions 424 may travel through the openings 411 to directly reach an exposed surface of the capping layer 414, without passing through the patterned absorber layer 416. Regardless of how the hydrogen ions 424 reach the capping layer 414 (e.g., by diffusion through portions of the patterned absorber layer 416 or directly through the openings 411), the hydrogen ions 424 may react with a metal layer within the capping layer 414 (e.g., such as Ru) to form hydrogen ($H_2$) 420. In some embodiments, the hydrogen 420 formed at the exposed surface of the capping layer 414 may be directly released to the atmosphere via the openings 411. In some cases, hydrogen 420 formed at the interface 426 between the absorber layer 416 and the capping layer 414 may diffuse to an adjacent opening 411, instead of accumulating at the interface 426, and then be released to the atmosphere via the adjacent opening 411. Thus, by employing the mask 402 that includes the opening area 408, where a surface area coverage of the absorber layer 416 has been reduced by formation of openings within the opening area 408, hydrogen (and/or helium) accumulation between the capping layer and the absorber layer is reduced and/or eliminated, thereby reducing and/or eliminating surface blistering and layer splitting.

As discussed above, the EUV exposure process performed in the lithography system 100 (within which the mask 402 is secured to the mask stage 106) is performed in a vacuum environment including ambient hydrogen 420. In various embodiments, the hydrogen 420 within the lithography system 100 may be regularly, and in some cases continuously, flushed or purged from the system 100 for particle removal and to maintain system purity. Thus, in various embodiments, the hydrogen 420, whether directly released to the atmosphere via the openings 411 or which diffuses to an adjacent opening 411 to be released to the atmosphere via the adjacent opening 411, may be flushed as part of the regular system 100 flush or purge. However, regardless of the presence of the hydrogen 420, EUV exposure processes may continue to be performed since the EUV exposure processes are normally performed in such a hydrogen 420 ambient. Most notably, and in accordance with embodiments of the present disclosure, the openings within the opening area 408 will prevent or significantly reduce the accumulation of hydrogen 420 between the capping layer and the absorber layer, as discussed herein.

As noted above, there may be any number of a plurality of openings within an opening area (e.g., such as the opening area 408), with each opening having any of a plurality of various shapes and sizes. In some embodiments, the larger the area of an opening, the better the hydrogen release (e.g., release of the hydrogen formed by reaction of hydrogen ions with the capping layer metal). In addition, the geometrical design and dimensions of an opening are not limited to any particular geometrical design and/or dimension, as long as the opening remains within the opening area, and as long as the main pattern area is not affected by openings within the opening area. In some embodiments, openings within the opening area may include any of a variety of shapes such as circular, oval, rectangular, square, triangular, quadrilateral, parallelogram, diamond, trapezoidal, pentagonal, hexagonal, or other desired shape from the top view perspective (e.g., similar to the view shown in FIG. 4A). In some examples, a distance between the main pattern area and the opening area, or the distance between the main pattern area and the nearest opening within the opening area, may be less than or equal to about 5 microns. Also, in some embodiments, a width of an individual opening within the opening area may be less than or equal to about 20 nm. Additional details and examples of openings that may be formed within the opening area are described in more detail below with reference to FIGS. 5-11.

In particular, FIGS. 5-11 illustrate exemplary embodiments of various shapes, mask layouts, and sizes of openings that may be formed within the opening area (e.g., such as the opening area 408). It will be understood that the examples shown and discussed are merely exemplary, are not meant to be limiting, and that other shapes, layouts, and sizes of openings may be equally used without departing from the scope of the present disclosure. For instance, in at least one example, an opening may be substantially equal to a size of the opening area 408, such that the absorber layer may be removed from an entirety of the opening area 408. Also, in at least some examples, the selection of opening shapes, layouts, and sizes formed with the opening area 408 may be determined based on the features defined within the adjacent main pattern area 404. For instance, a more critical feature formed with the main pattern area 404 may benefit from or be better protected by a greater number and/or larger size of openings within the opening area 408 (e.g., by a corresponding reduction/elimination of nearby surface blistering and layer splitting), while a less critical feature formed within the main pattern area 404 may be sufficiently protected by a lesser number and/or smaller size of openings within the opening area 408.

With reference now to FIG. 5, illustrated therein is a top view of a mask 502, according to some embodiments. The mask 502 may be generally similar to the mask 402, albeit with a different layout design for openings within the opening area 408 and a different spacing between the main pattern area 404 and the opening area 408. As noted above, the opening area 408 is disposed between the main pattern areas 404, 406 and spaced away from the main pattern areas 404, 406. In the present example, the mask 502 includes a single circular opening 504 disposed within the opening area 408. In some embodiments, the circular opening 504 may have a width 'W' that is less than or equal to about 20 nm. The width 'W' may be substantially equal to a diameter of the circular opening 504. FIG. 5 further shows the distances 'D1' and 'D2', where each of the distances 'D1' and 'D2' may be less than or equal to about 5 microns, as previously noted, as well as a distance 'D3' which is less than both 'D1' and 'D2'. In some cases, the distance 'D3' may be equal to about 0 nm, meaning that the main pattern area 404 and the opening area 408 abut each other. While the example of FIG. 5 shows the main pattern area 404 being a distance 'D3' away from the opening area 408, the distance 'D1' between the main pattern area 404 and the nearest opening within the opening area 408 (e.g., the circular opening 504, in this example) remains less than or equal to about 5 microns.

Referring to FIG. 6, illustrated therein is a top view of a mask 602, according to some embodiments. The mask 602 may be similar to the mask 402, with a different layout design for openings within the opening area 408. The opening area 408 is disposed between the main pattern areas 404, 406 and spaced away from the main pattern areas 404, 406 by a distance 'D1' and 'D2', respectively, where each of the distances 'D1' and 'D2' may be less than or equal to about 5 microns. In the present example, the mask 602 includes a plurality of oval/round openings 604 disposed within the opening area 408. In some embodiments, the plurality of oval/round openings 604 may be arranged in an array pattern. In some examples, each of the plurality of oval/round openings 604 may have a width 'W' that is less than or equal to about 20 nm, and a spacing 'S' between adjacent openings may be less than or equal to about 1 micron. In some cases, if the plurality of oval/round openings 604 are round, then the width 'W' may be substantially equal to a diameter of the openings 604. In some embodiments, if the plurality of oval/round openings 604 are oval, then the width 'W' may be substantially equal to a minor axis diameter of the openings 604. For purposes of this discussion, the minor axis diameter is the shorter of two perpendicular diameters (minor axis diameter and major axis diameter) which define an oval.

FIG. 7 illustrates a top view of a mask 702, according to some embodiments. The mask 702 may be similar to the mask 402, with a different layout design for openings within the opening area 408. The opening area 408 is disposed between the main pattern areas 404, 406 and spaced away from the main pattern areas 404, 406 by a distance 'D1' and 'D2', respectively, where each of the distances 'D1' and 'D2' may be less than or equal to about 5 microns. In the present example, the mask 702 includes a plurality of rectangular openings 704 disposed within the opening area 408. In some embodiments, each of the rectangular openings 704 may have a width 'W' that is less than or equal to about 20 nm. In some cases, each of the rectangular openings 704 may also have a length 'L1' less than or equal to about 3 microns. In some embodiments, a spacing 'S' between adjacent rectangular openings 704 may be less than or equal to about 1 micron. In some embodiments, the plurality of rectangular openings 704 may be arranged in an array pattern and may be oriented in a Y-direction, as indicated.

FIG. 8 illustrates a top view of a mask 802, according to some embodiments. The mask 802 may be similar to the mask 402, with a different layout design for openings within the opening area 408. The opening area 408 is disposed between the main pattern areas 404, 406 and spaced away from the main pattern areas 404, 406 by a distance 'D1' and 'D2', respectively, where each of the distances 'D1' and 'D2' may be less than or equal to about 5 microns. In the present example, the mask 802 includes a plurality of rectangular openings 804 disposed within the opening area 408. In some embodiments, each of the rectangular openings 804 may have the width 'W' that is less than or equal to about 20 nm. In some cases, the rectangular openings 804 may have different lengths 'Lx'. For example, the length 'Lx' may be equal to about 100 nm, 150 nm, 160, nm, 1 micron, 3 microns, or other appropriate value. In some embodiments, a spacing 'S' (in an X-direction) between adjacent rectangular openings 804 may be less than or equal to about 1 micron, and a spacing 'S1' (in a Y-direction) between adjacent rectangular openings 804 may be less than or equal to about 500 nm. In some cases, the spacing 'S1' may be referred to as an end-to-end spacing. By way of example, a total number of rectangular openings 804 (e.g., in an X-direction or a Y-direction) may be calculated by design rule based on a total length of the opening area 408 (e.g., in the X-direction or the Y-direction), the dimensions of individual openings, and the spacing therebetween. As one example, consider the opening area 408 has a length in the Y-direction of about 16 microns, where there are five rectangular openings spanning the Y-direction of the opening area 408, where four of the openings have a length equal to 3 microns, one opening has a length equal to 2 microns, and an end-to-end spacing between adjacent openings is 500 nm. Thus, a total length of the openings and spacings therebetween is equal to the length of the opening area 408. In another example, consider the opening area 408 has a length in the Y-direction of about 16 microns, where there are five rectangular openings spanning the Y-direction of the opening area 408, where all five of the openings have a length equal to 2.8 microns, and an end-to-end spacing between adjacent openings is 500 nm. Thus, a total length of the openings and spacings therebetween is equal to the length of the opening area 408. Many other examples of opening dimensions and spacings may equally be used, without departing from the scope of this disclosure. In some examples, the plurality of rectangular openings 804 may be oriented in a Y-direction, as indicated.

FIG. 9 illustrates a top view of a mask 902, according to some embodiments. The mask 902 may be similar to the mask 402, with a different layout design for openings within the opening area 408. The opening area 408 is disposed between the main pattern areas 404, 406 and spaced away from the main pattern areas 404, 406 by a distance 'D1' and 'D2', respectively, where each of the distances 'D1' and 'D2' may be less than or equal to about 5 microns. In the present example, the mask 902 includes first rectangular openings 904 having a first length 'L2' and second rectangular openings 906 having a second length 'L3' disposed within the opening area 408. In the illustrated embodiment, the second length 'L3' is greater than the first length 'L2'. However, in some examples, the first length 'L2' may be greater than the second length 'L3'. In various embodiments, the lengths 'L2' and 'L3' may have a variety of lengths similar to the lengths 'Lx', discussed above. In some embodiments, each of the rectangular openings 904, 906 may have a width 'W' that is less than or equal to about 20 nm. In some examples, a spacing 'S' (in an X-direction) between adjacent rectangular openings 904, 906 may be less than or equal to about 1 micron, and a spacing 'S1' (in a Y-direction) between adjacent rectangular openings 904 may be less than or equal to about 500 nm. In some embodiments, the plurality of rectangular openings 904, 906 may be arranged in an array pattern and may be oriented in a Y-direction, as indicated.

FIG. 10 illustrates a top view of a mask 1002, according to some embodiments. The mask 1002 may be similar to the mask 402, with a different layout design for openings within the opening area 408. The opening area 408 is disposed between the main pattern areas 404, 406 and spaced away from the main pattern areas 404, 406 by a distance 'D1' and 'D2', respectively, where each of the distances 'D1' and 'D2' may be less than or equal to about 5 microns. In the present example, the mask 1002 includes a plurality of rectangular openings 1004 disposed within the opening area 408. In some embodiments, each of the rectangular openings 1004 may have a width 'W' that is less than or equal to about 20 nm. In some cases, each of the rectangular openings 1004 may also have a length 'L4' less than or equal to about 5 microns. In some examples, a spacing 'S' between adjacent rectangular openings 1004 may be less than or equal to about 1 micron. In some embodiments, the plurality of rectangular openings 1004 may be arranged in an array pattern and may be oriented in an X-direction, as indicated.

FIG. 11 illustrates a top view of a mask 1102, according to some embodiments. The mask 1102 may be similar to the mask 402, with a different layout design for openings within the opening area 408. The opening area 408 is disposed between the main pattern areas 404, 406 and spaced away from the main pattern areas 404, 406 by a distance 'D1' and 'D2', respectively, where each of the distances 'D1' and 'D2' may be less than or equal to about 5 microns. In the present example, the mask 1102 includes a plurality of a first type of openings 1104, a plurality of a second type of openings 1106, and a plurality of a third type of openings 1108 disposed within the opening area 408. While three types of openings are illustrated, it will be understood that more or less types of openings may also be formed within the opening area 408 without departing from the scope of the present disclosure. In some examples, the first type of openings 1104 may be similar to the circular opening 504 or the plurality of oval/round openings 604 discussed above, thus the first type of openings 1104 may also have a width 'W' (or diameter) that is less than or equal to about 20 nm. In some embodiments, each of the second type of openings 1106 and the third type of openings 1108 may have a width 'W' that is less than or equal to about 20 nm. In some cases, the second type of openings 1106 may have a length 'L5' and the third type of openings 1108 may have a length 'L6'. In various embodiments, the lengths 'L5' and 'L6' may have a variety of lengths similar to the lengths 'Lx', discussed above. In some embodiments, the second type of openings 1106 may be oriented in a Y-direction, and the third type of openings 1108 may be oriented in an X-direction, as indicated.

Referring now to FIG. 12, illustrated therein is a flow chart of a simplified method 1200 for fabricating and using an EUV mask, according to one or more aspects of the present disclosure. The method 1200 begins at block 1202 where an EUV mask is fabricated. In an embodiment of block 1202, the fabricated EUV mask may include any of the masks 108, 402, 502, 602, 702, 802, 902, 1002, or 1102, discussed above. Further, as previously noted, an EUV mask fabrication process may two process stages: (1) a mask blank fabrication process, and (2) a mask patterning process. In some embodiments, the mask blank fabrication process includes deposition of suitable layers (e.g., such as a multi-layer structure) on a substrate. By way of example, a capping layer (e.g., ruthenium) is formed over the multilayer coated substrate followed by deposition of an absorber layer. The mask blank may then be patterned (e.g., the absorber layer is patterned) to form a desired pattern on the EUV mask. In some embodiments, an ARC layer may be deposited over the absorber layer prior to patterning the mask blank. In various examples, the pattern formed in the absorber layer may include a main pattern area and an opening area spaced a distance from the main pattern area, as described above. In some embodiments, the main pattern area defines features corresponding to a semiconductor device or circuit, and the opening area includes at least one opening that exposes the underlying capping layer (e.g., Ru layer). In at least some embodiments, and in an embodiment of block 1202, the main pattern area (including corresponding features that define at least part of a semiconductor device or circuit) and the opening area (including corresponding opening(s) that exposes the capping layer) may be formed simultaneously. That is, in some examples, the absorber layer in each of the main pattern area and the opening area may be patterned simultaneously to provide a patterned EUV mask.

The method 1200 then proceeds to block 1204 where a photolithography process is performed using the patterned EUV mask. For example, the patterned EUV mask may be used to transfer circuit and/or device patterns onto a semiconductor wafer using an EUV lithography system (e.g. such as the system 100). In some embodiments, the EUV mask is loaded/secured onto a mask stage of the EUV lithography system, and the semiconductor wafer is loaded/secured onto a substrate stage of the EUV lithography system. In operation, EUV light from a radiation source of the EUV lithography system is directed toward an illuminator of the EUV lithography system and projected onto the EUV mask including the main pattern area and the opening area. A reflected mask image is then directed toward projection optics of the EUV lithography system, which focuses the EUV light and projects the EUV light onto the semiconductor wafer loaded on the substrate stage to expose an EUV resist layer deposited thereupon, thereby transferring a pattern from the EUV mask to the semiconductor wafer. In some embodiments, and during the operation of the EUV lithography system, hydrogen gas may be released from the EUV mask from the at least one opening formed within the opening area, thus providing for the reduction and/or elimination of the blistering and peeling issue faced in at least some processes. In various embodiments, the patterns defined by the EUV mask can be transferred over and over onto multiple wafers through various lithography processes. In addition, a set of EUV masks, each of which may include a main pattern area and an opening area spaced a distance from the main pattern area, may be used to construct a complete IC device and/or circuit. Additional process steps may be implemented before, during, and after the method 1200, and some process steps described above may be replaced or eliminated in accordance with various embodiments of the method 1200.

Figure 13:
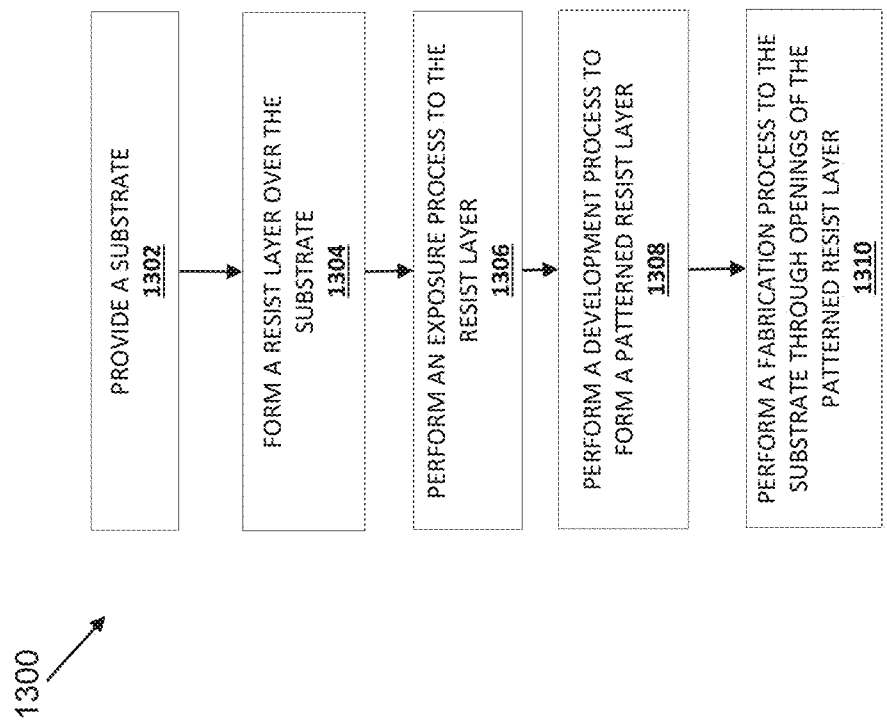
FIG. 13 is a flow chart of a method for manufacturing a semiconductor device, according to one or more aspects of the present disclosure.

With reference to FIG. 13, illustrated therein is a flow chart of a more detailed method 1300 for manufacturing a semiconductor device and/or IC using an EUV mask as described above, in accordance with various embodiments. The method 1300 may be implemented, in whole or in part, by a lithography system such as the EUV system 100. However, in some embodiments, portions of the method 1300 may be implemented by other types of lithography systems such as a deep ultraviolet (DUV) lithography system, an electron beam (e-beam) lithography system, an X-ray lithography system, and/or other lithography system. It will be understood that additional operations can be provided before, during, and after the method 1300, and some operations described can be replaced, eliminated, or moved around for additional embodiments of the method. It is also noted that the method 1300 is exemplary, and is not intended to limit the present disclosure beyond what is explicitly recited in the claims that follow. The method 1300 is further described below in conjunction with FIGS. 14A, 14B, 14C, 14D, and 14E.

In particular, FIGS. 14A, 14B, 14C, 14D, and 14E provide cross-sectional views of a semiconductor device 1400 at various fabrication stages, constructed in accordance with some embodiments of the method 1300. The semiconductor device 1400 may be an intermediate device fabricated during processing of an IC, or a portion thereof, that may include logic circuits, memory structures, passive components (such as resistors, capacitors, and inductors), and active components such as diodes, field-effect transistors (FETs), metal-oxide semiconductor field effect transistors (MOSFET), complementary metal-oxide semiconductor (CMOS) transistors, bipolar transistors, high voltage transistors, high frequency transistors, fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

The method 1300 begins at block 1302 where a substrate is provided. With reference to the example of FIG. 14A, in an embodiment of block 1302, illustrated therein is a cross-section view of the semiconductor device 1400 including a substrate 1402. In some embodiments, the substrate 1402 may include a semiconductor substrate such as silicon. However, in some embodiments, the substrate may alternatively or additionally include other materials such as germanium, silicon carbide (SiC), silicon germanium (SiGe), diamond, compound semiconductors, alloy semiconductors, and the substrate 1402 may optionally include one or more epitaxial layers (epi-layers), may be strained for performance enhancement, may include a silicon-on-insulator (SOI) structure, and/or have other suitable enhancement features. In some embodiments, the substrate 1402 may also include conductive or insulating layers formed on the substrate 1402, and the substrate 1402 may include various doping configurations depending on design requirements as is known in the art.

In some embodiments, the substrate 1402 includes an underlayer (or material layer) 1404 to be processed, such as to be patterned or to be implanted. For example, the underlayer 1404 may include a hard mask layer to be patterned. In some cases, the underlayer 1404 may include an epitaxial semiconductor layer to be ion implanted. However, in some embodiments, the substrate 1402 may not include an underlayer and an underlayer (e.g., 1404) is instead optionally formed over the substrate 1402. In an embodiment, the underlayer 1404 may include a hard mask layer including material(s) such as silicon oxide, silicon nitride (SiN), silicon oxynitride, titanium nitride, or other suitable material or composition. In some embodiments, the underlayer 1404 may include an anti-reflection coating (ARC) layer such as a nitrogen-free anti-reflection coating (NFARC) layer including material(s) such as silicon oxide, silicon oxygen carbide, or plasma enhanced chemical vapor deposited silicon oxide. In various embodiments, the underlayer 1404 may include a high-k dielectric layer, a gate layer, a hard mask layer, an interfacial layer, a capping layer, a diffusion/barrier layer, a dielectric layer, a conductive layer, other suitable layers, and/or combinations thereof.

The method 1300 proceeds to block 1304 where a resist layer (an EUV resist layer, in some examples) 1406 is formed over the substrate 1402, or over the optional underlayer 1404 (FIG. 14A). In various examples, the resist layer 1406 is sensitive to radiation used in a lithography exposure process and has a resistance to etching processes (or ion implantation processes). In some embodiments, the resist layer 1406 may be formed by a spin-coating process. In some examples, prior to forming the resist layer 1406, an adhesion layer (e.g., such as an HMDS layer) is formed over the substrate 1402, or over the optional underlayer 1404. In some embodiments, after formation of the resist layer 1406, and prior to performing an exposure process, a pre-bake process may be performed, for example, to evaporate solvents and to densify the resist layer 1406. In various embodiments, the resist layer 1406 may be sensitive to various types of radiation, such as DUV radiation (e.g., 248 nm radiation from a KrF laser or 193 nm radiation from an ArF laser), EUV radiation (e.g., 13.5 nm radiation), an electron beam (e-beam), or an ion beam. In at least some examples, and in accordance with various embodiments, the resist layer 1406 is sensitive to EUV radiation. In some examples, the resist layer 1406 is soluble in a positive tone developer or negative tone developer after being exposed by EUV radiation.

The method 1300 proceeds to block 1306 where a pattern is exposed onto the resist-coated substrate. With reference to the example of FIG. 14B, in an embodiment of block 1306, illustrated therein is a cross-section view of the device 1400, where the resist layer 1406 (FIG. 14A) has been exposed (e.g., by a lithographic imaging system) through an intervening mask. In at least some embodiments, the resist layer 1406 is exposed by EUV radiation (e.g., 13.5 nm) using an EUV system (e.g., such as the system 100) and an EUV mask such as any of the masks 108, 402, 502, 602, 702, 802, 902, 1002, or 1102, discussed above. Alternatively, in some embodiments, the resist layer 1406 may be exposed by DUV radiation (e.g., from a 248 nm KrF excimer laser or a 193 nm ArF excimer laser), X-ray radiation, an e-beam, an ion beam, and/or other suitable radiation sources. In some embodiments, and when using an EUV system, the exposure of block 1306 may be performed in a vacuum and in a hydrogen ambient, as discussed above. Moreover, in various embodiments and during the operation of the EUV lithography system, hydrogen gas may be released from the EUV mask from one or more openings formed within an opening area of the EUV mask, instead of accumulating between the capping layer and absorber layer of the EUV mask. As a result, and in accordance with various embodiments, blistering and/or peeling of the absorber layer of the EUV mask may be eliminated and/or significantly reduced. Furthermore, patterns formed using the EUV mask having the one or more openings may have a high fidelity as compared to a target pattern, providing for improved device and/or circuit performance.

In some embodiments, after the exposure of block 1306, a baking process may be performed. For example, in some embodiments, after exposure of the resist layer 1406, and prior to performing a resist development process, a post-bake process may be performed to stabilize and harden the developed resist layer. In some examples, and as a result of the exposure process of block 1306, a latent pattern is formed in the resist layer 1406. By way of example, the latent pattern refers to the exposed pattern on the resist layer 1406, which will subsequently become a physical resist pattern, after a developing process. In various embodiments, the latent pattern of the resist layer 1406 may include unexposed portions 1406$a$ and exposed portions 1406$b$. In various embodiments, the exposed portions 1406$b$ of the resist layer 1406 may be physically or chemically changed as a result of the exposure process of block 1306. In some embodiments, if a positive-tone resist has been used, the exposed portions 1406$b$ will be dissolved during a subsequent development process. In some cases, if a negative-tone resist has been used, the exposed portions 1406$b$ will become insoluble and a subsequent development process may instead dissolve the unexposed portions 1406$a$.

The method 1300 proceeds to block 1308 where a development process is performed to form a patterned resist layer. With reference to the example of FIGS. 14B and 14C, in an embodiment of block 1308, after formation of the latent image, including the unexposed and exposed portions 1406$a$/1406$b$, a resist development process is performed, resulting in a patterned resist layer 1406'. In some embodiments, the resist development process includes a wet chemical development process, as known in the art. As discussed above, if a negative-tone resist has been used, the exposed portions 1406$b$ will become insoluble. Thus, referring to the example of FIG. 14C which shows the device 1400 after a development process, use of a negative-tone resist is illustrated.

The method 1300 proceeds to block 1310, where a fabrication process is performed to the substrate through openings of the patterned resist layer. For example, a fabrication process may be performed to the semiconductor device 1400 using the patterned resist layer 1406' as a mask, such that the fabrication process is applied to the portions of the semiconductor device 1400 within the openings of the patterned resist layer 1406' (e.g., the exposed regions of the underlayer 1404), while other portions covered by the patterned resist layer 1406' are protected from the fabrication process. In some embodiments, the fabrication process of block 1310 may include an etching process applied to the underlayer 1404 using the patterned resist layer 1406' as an etch mask, thereby transferring the pattern from the patterned resist layer 1406' to the underlayer 1404. Alternatively, in some embodiments, the fabrication process of block 1310 may include an ion implantation process applied to the semiconductor device 1400 using the patterned resist layer 1406' as an ion implantation mask, thereby forming various doped features in the semiconductor device 1400 (e.g., within the underlayer 1404).

As described above, and in the present examples, the underlayer 1404 may include a hard mask layer. In furtherance of this example, the pattern of the patterned resist layer 1406' may first be transferred to the underlayer 1404 (e.g., the hard mask layer 1404), forming a patterned hard mask layer 1404' (FIG. 14D), then to other layers of the substrate 1402. For example, the hard mask layer 1404 may be etched through openings of the patterned resist layer 1406' using a dry (plasma) etching process, a wet etching process, a combination thereof, and/or other etching methods. For example, a dry etching process may include an oxygen-containing gas, a fluorine-containing gas, a chlorine-containing gas, a bromine-containing gas, an iodine-containing gas, other suitable gases and/or plasmas, and/or combinations thereof. In some embodiments, the patterned resist layer 1406' may be partially or completely consumed during the etching of the hard mask layer 1404 and formation of the patterned hard mask layer 1404'. In an embodiment, any portion of the patterned resist layer 1406' remaining after the etching process may be stripped off, leaving a patterned hard mask layer 1404' over the substrate 1402, as illustrated in FIG. 14E.

The method 1300 may include other steps before, during or after the steps described above. In an embodiment, the substrate 1402 is a semiconductor substrate and the method 1300 proceeds to forming fin field effect transistor (FinFET) devices. In such an example, the method 1300 may further include forming a plurality of active fins in the semiconductor substrate 1402. Additionally, and in furtherance of this example, the block 1310 may further include etching the substrate 1402 through the openings of the patterned hard mask 1404' to form trenches in the substrate 1402; filling the trenches with a dielectric material; performing a chemical mechanical polishing (CMP) process to form shallow trench isolation (STI) features; epitaxial growth and/or recessing of the STI features to form fin-like active regions. In some embodiments, the method 1300 includes other steps to form a plurality of gate electrodes, gate spacers, doped source/drain regions, contacts for gate/source/drain features, etc. In some embodiments, subsequent processing may form various contacts/vias/lines and multilayers interconnect features (e.g., metal layers and interlayer dielectrics) on the substrate, configured to connect the various features to form a functional circuit that may include one or more devices (e.g., one or more FinFET devices). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 1300, and some process steps described above may be replaced or eliminated in accordance with various embodiments of the method 1300.

With respect to the description provided herein, the present disclosure provides embodiments for an EUV mask and related methods. In various embodiments, an EUV mask includes one or more openings (in an absorber layer) formed within an opening area of the EUV mask, where the opening area is spaced away from a main pattern area. The openings may expose the underlying capping layer (e.g., such as a Ru capping layer), and the openings may be disposed a sufficient distance away from the main pattern area so that the main pattern area will not be affected by the one or more openings. In various embodiments, the addition of the one or more openings in the absorber layer, and away from the main pattern area, provides for reduced thermal film expansion (e.g., which causes the surface blistering and layer splitting). Thus, the EUV mask structure disclosed herein provides for reduction and/or elimination of the blistering and peeling issue faced in at least some processes. In some embodiments, thermal expansion of the EUV mask may be further reduced by increasing the size and number of the openings within the opening area. By way of example, the openings within the opening area provide for the release of hydrogen gas to the atmosphere, without accumulation of hydrogen between the absorber layer and the capping layer. Additionally, and in some embodiments, the one or more openings in the opening area and features formed in the main pattern area may be formed simultaneously. Those of skill in the art will readily appreciate that the methods and structures described herein may be applied to a variety of other masks and lithography process to advantageously achieve similar benefits from such other masks and lithography processes without departing from the scope of the present disclosure.

Thus, some embodiments of the present disclosure described a method of fabricating a semiconductor device including providing a first substrate and forming a resist layer over the first substrate. In some embodiments, the method further includes performing an exposure process to the resist layer. The exposure process includes exposing the resist layer to a radiation source through an intervening mask. In some examples, the intervening mask includes a second substrate, a multi-layer structure formed over the second substrate, a capping layer formed over the multi-layer structure, and an absorber layer disposed over the capping layer. In some embodiments, the absorber layer includes a first main pattern area and an opening area spaced a distance from the first main pattern area. In various examples, the method further includes, after performing the exposure process, developing the exposed resist layer to form a patterned resist layer.

In further embodiments, discussed is a method including depositing a first material layer on a semiconductor substrate, the first material layer including a hardmask. In some embodiments, the method further includes forming a second material layer over the first material layer, the second material layer including a photoresist layer. In various examples, the method further includes exposing the photoresist layer using an EUV lithography system including an EUV mask. The EUV mask includes a multi-layer structure, a capping layer formed over the multi-layer structure, and an absorber layer formed over the capping layer, and the absorber layer includes a main pattern area and an opening area spaced a distance from the main pattern area.

In addition, some embodiments discussed a method including fabricating an EUV mask. The fabricating the EUV mask includes forming a capping layer over a multi-layer structure disposed on a substrate, forming an absorber layer over the capping layer, and patterning the absorber layer to form a main pattern area and an opening area spaced a distance from the main pattern area. In some embodiments, the main pattern area and the opening area are patterned simultaneously. In some examples, the method further includes performing a photolithography process using the EUV mask, where the photolithography process transfers a pattern from the EUV mask to a semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    exposing a resist layer to a radiation source through an intervening mask, wherein the intervening mask includes:
    reflective multi-layers disposed over a substrate;
    a ruthenium (Ru) capping layer disposed over the reflective multi-layers; and
    a patterned absorber layer disposed over the Ru capping layer, the patterned absorber layer including at least tantalum (Ta) and boron (B), wherein the patterned absorber layer includes a first patterned area that exposes a first region of the Ru capping layer and a second patterned area including at least one opening, wherein the second patterned area abuts the first patterned area, wherein the second patterned area exposes a second region of the Ru capping layer, and wherein the second patterned area includes first and second rectangular openings arranged end-to-end in a first direction, and wherein the first and second rectangular openings have different lengths; and
    after exposing the resist layer, developing the exposed resist layer to form a patterned resist layer.

2. The method of claim 1, wherein the intervening mask includes an extreme ultraviolet (EUV) mask.

3. The method of claim 1, wherein the intervening mask further includes an anti-reflective coating (ARC) layer disposed over a top surface of the patterned absorber layer.

4. The method of claim 1, wherein the second patterned area includes a plurality of openings arranged in an array pattern.

5. The method of claim 1, wherein a distance between the first patterned area and the at least one opening in the second patterned area is less than or equal to about 5 microns.

6. The method of claim 1, wherein the absorber layer includes a TaBO layer, a TaBN layer, a TaBO/TaBN layer, or a $Ta_xB_yO_zN_u$ layer, wherein x, y, z, and u each include a positive integer.

7. The method of claim 1, wherein the patterned absorber layer includes a third patterned area that abuts the second patterned area, wherein the first patterned area abuts a first side of the second patterned area, and wherein the third patterned area abuts a second side of the second patterned area opposite the first side.

8. The method of claim 1, wherein the first patterned area defines features corresponding to a semiconductor device or circuit.

9. The method of claim 8, wherein the patterned resist layer includes the features corresponding to the semiconductor device or circuit.

10. A method, comprising:
    coating a substrate with a photoresist layer; and exposing, using a first extreme ultraviolet (EUV) system and a first EUV mask of a plurality of EUV masks, the photoresist layer, wherein the first EUV mask includes a ruthenium (Ru) capping layer and a patterned absorber layer formed over the Ru capping layer, wherein the patterned absorber layer includes a plurality of main pattern areas and a plurality of opening areas each having a plurality of openings arranged in an array pattern, the plurality of opening areas interposing the plurality of main pattern areas and separated from each of the plurality of main pattern areas, wherein each of the plurality of main pattern areas and the plurality of opening areas expose different regions of the Ru capping layer, and wherein the plurality of openings in each of the plurality of opening areas are free of features that define or form part of a semiconductor device or circuit;

wherein the plurality of openings in at least one of the plurality of opening areas include a first plurality of rectangular openings arranged end-to-end in a first direction and a second plurality of rectangular openings arranged end-to-end in the first direction, wherein the first and second plurality of rectangular openings are laterally adjacent to each other in a second direction perpendicular to the first direction, wherein two or more rectangular openings of the first plurality of rectangular openings have different lengths, and wherein two or more rectangular openings of the second plurality of rectangular openings have different lengths.

11. The method of claim 10, wherein the different regions of the Ru capping layer have a same composition.

12. The method of claim 10, wherein plurality of EUV masks are used to fabricate a complete integrated circuit (IC) device or circuit, and wherein each EUV mask of the plurality of EUV masks includes at least one main pattern area and at least one opening area separated from the at least one main pattern area, the at least one opening area including first and second rectangular openings arranged end-to-end in a first direction, and wherein the first and second rectangular openings have different lengths.

13. The method of claim 10, further comprising after the exposing the photoresist layer, developing the exposed photoresist layer to transfer a pattern from the first EUV mask to the photoresist layer, wherein the pattern includes features corresponding to the semiconductor device or circuit defined by the plurality of main pattern areas.

14. A method, comprising:
fabricating an extreme ultraviolet (EUV) mask, wherein the fabricating the EUV mask includes:

forming a ruthenium (Ru) capping layer over a first substrate, the Ru capping layer having a uniform composition;
forming an absorber layer over the capping layer; and
patterning the absorber layer to form a patterned absorber layer including at least one main pattern area and an opening area separated from the at least one main pattern area, wherein the at least one main pattern area and the opening area expose a first region of the Ru capping layer and a second region of the Ru capping layer, respectively, each of the first and second regions having the uniform composition, wherein the opening area includes each of a first array of circular openings in the top view, a second array of rectangular openings oriented in a first direction in the top view, and a third array of rectangular openings oriented in a second direction perpendicular to the first direction in the top view, wherein both of the second and third arrays of rectangular openings include rectangular openings arranged end-to-end in respective ones of the first and second directions, and wherein at least some of the rectangular openings arranged end-to-end have different lengths; and transferring, using an EUV lithography system and the EUV mask, a pattern from the EUV mask to a second substrate, wherein the pattern transferred to the second substrate includes the at least one main pattern area and the opening area defined by the patterned absorber layer, and wherein the opening area defined by the patterned absorber layer is free of features corresponding to a semiconductor device or circuit.

15. The method of claim 14, further comprising:
prior to patterning the absorber layer, forming an anti-reflective coating (ARC) layer over the absorber layer; and
patterning the ARC layer and the absorber layer to form the at least one main pattern area and the opening area.

16. The method of claim 14, wherein the at least one main pattern area defines features corresponding to the semiconductor device or circuit.

17. The method of claim 4, wherein the plurality of openings are free of features that define or form part of a semiconductor device or circuit.

18. The method of claim 1, wherein an end-to-end spacing between the first and second rectangular openings is equal to about 500 nm.

19. The method of claim 3, wherein the ARC layer has a same composition as the patterned absorber layer.

20. The method of claim 15, wherein the ARC layer includes tantalum (Ta) and boron (B).

* * * * *